(12) United States Patent
Tseng et al.

(10) Patent No.: US 12,062,742 B2
(45) Date of Patent: Aug. 13, 2024

(54) PACKAGE STRUCTURE AND MANUFACTURING METHOD OF THE SAME

(71) Applicant: Unimicron Technology Corp., Taoyuan (TW)

(72) Inventors: Hao-Wei Tseng, Hsinchu County (TW); Chi-Hai Kuo, Taoyuan (TW); Jeng-Ting Li, Pingtung County (TW); Ying-Chu Chen, Chiayi (TW); Pu-Ju Lin, Hsinchu (TW); Cheng-Ta Ko, Taipei (TW)

(73) Assignee: Unimicron Technology Corp., Taoyuan (TW)

(*) Notice: Subject to any disclaimer, the term of this patent is extended or adjusted under 35 U.S.C. 154(b) by 401 days.

(21) Appl. No.: 17/653,659

(22) Filed: Mar. 7, 2022

(65) Prior Publication Data
US 2023/0231087 A1    Jul. 20, 2023

(30) Foreign Application Priority Data

Jan. 17, 2022   (TW) .................................. 111101905

(51) Int. Cl.
*H01L 33/54* (2010.01)
*H01L 23/00* (2006.01)
*H01L 25/075* (2006.01)

(52) U.S. Cl.
CPC ............. *H01L 33/54* (2013.01); *H01L 24/83* (2013.01); *H01L 25/0753* (2013.01); *H01L 24/29* (2013.01); *H01L 24/32* (2013.01); *H01L 2224/29194* (2013.01); *H01L 2224/32227* (2013.01); *H01L 2224/83099* (2013.01); *H01L 2224/83203* (2013.01); *H01L 2224/83856* (2013.01); *H01L 2224/83862* (2013.01);
(Continued)

(58) Field of Classification Search
CPC ..... H01L 33/54; H01L 24/83; H01L 25/0753; H01L 24/29; H01L 24/32; H01L 2224/29194
See application file for complete search history.

(56) References Cited

U.S. PATENT DOCUMENTS 11,538,849 B2 * 12/2022 Cok .................. H01L 27/15
2021/0202449 A1   7/2021 Shin et al.
(Continued)

FOREIGN PATENT DOCUMENTS

CN  109904179 A  6/2019
TW  202011535 A  3/2020
TW  202013768 A  4/2020

*Primary Examiner* — Thao P Le
(74) *Attorney, Agent, or Firm* — CKC & Partners Co., LLC

(57) ABSTRACT

A package structure includes a substrate, a plurality of conductive pads, a light-emitting diode, a photo imageable dielectric material, and a black matrix. The substrate includes a top surface. The conductive pads are located on the top surface of the substrate. The light-emitting diode is located on the conductive pads. The photo imageable dielectric material is located between the light-emitting diode and the top surface of the substrate and between the conductive pads. An orthogonal projection of the light-emitting diode on the substrate is overlapped with an orthogonal projection of the photo imageable dielectric material on the substrate. The black matrix is located on the top surface of the substrate and the conductive pads.

10 Claims, 11 Drawing Sheets

(52) U.S. Cl.
CPC ............... *H01L 2224/8389* (2013.01); *H01L 2924/12041* (2013.01); *H01L 2933/005* (2013.01)

(56) References Cited

U.S. PATENT DOCUMENTS

| | | | | |
|---|---|---|---|---|
| 2021/0405797 | A1* | 12/2021 | Bae | G06F 3/0412 |
| 2021/0408103 | A1* | 12/2021 | Dai | H01L 27/156 |
| 2022/0209157 | A1* | 6/2022 | Lee | H10K 50/131 |
| 2022/0246673 | A1* | 8/2022 | Suh | H01L 27/156 |
| 2022/0352435 | A1* | 11/2022 | Suh | G02B 5/00 |
| 2022/0367370 | A1* | 11/2022 | Chi | H01L 23/552 |
| 2023/0154424 | A1* | 5/2023 | Shi | G09G 3/3406 345/690 |
| 2023/0170355 | A1* | 6/2023 | Byun | H01L 25/0753 257/72 |
| 2023/0200176 | A1* | 6/2023 | Lee | H01L 33/44 257/40 |
| 2023/0231087 | A1* | 7/2023 | Tseng | H01L 24/83 257/98 |
| 2023/0290909 | A1* | 9/2023 | Li | H01L 33/502 |

* cited by examiner

PACKAGE STRUCTURE AND MANUFACTURING METHOD OF THE SAME

CROSS-REFERENCE TO RELATED APPLICATION

This application claims priority to Taiwan Application Serial Number 111101905, filed Jan. 17, 2022, which is herein incorporated by reference in its entirety.

BACKGROUND

Field of Invention

The present invention relates to a package structure and a manufacturing method of the package structure.

Description of Related Art

Light-emitting diode has advantages such as high luminous efficiency and long life-cycle. Light-emitting diode devices are widely used, for example, in consumer electronics, lamps for vehicle, lighting devices, or decorations.

Light-emitting diode package structures and manufacturing method face several challenges such as how to improve flatness and reliability in bonding process, which is crucial for mass transfer technique for micro-LED. In a conventional light-emitting diode package structure, a black matrix is commonly used to shield reflective light from the conductive pad underlying the light-emitting diode. However, the conductive pad cannot be completely covered due to large tolerance (about 100 um) of the exposure and development techniques for the black matrix. Therefore, the conductive pads exposed from the black matrix may reflect the light form the light-emitting diode, and therefore the contrast is reduced.

Accordingly, it is still a development direction for the industry to provide a package structure which can improve those problems mentioned above.

SUMMARY

One aspect of the present disclosure is a package structure.

In some embodiments, the package structure includes a substrate, a plurality of conductive pads, a light-emitting diode, a photo imageable dielectric material, and a black matrix. The substrate includes a top surface. The conductive pads are located on the top surface of the substrate. The light-emitting diode is located on the conductive pads. The photo imageable dielectric material is located between the light-emitting diode and the top surface of the substrate and between the conductive pads. An orthogonal projection of the light-emitting diode on the substrate is overlapped with an orthogonal projection of the photo imageable dielectric material on the substrate. The black matrix is located on the top surface of the substrate and the conductive pads.

In some embodiments, the photo imageable dielectric material is in contact with a bottom surface of the light-emitting diode facing the substrate.

In some embodiments, the black matrix is in contact with a side wall of the light-emitting diode.

In some embodiments, the package structure includes a encapsulant located above the black matrix and the light-emitting diode.

In some embodiments, the encapsulant and the conductive pads are separated by the black matrix.

Another aspect of the present disclosure is a manufacturing method of a package structure.

In some embodiments, the manufacturing method of a package structure includes forming a plurality of conductive pads on a top surface of a substrate; disposed a photo imageable dielectric material that is semi-cured between the top surface of the substrate and the conductive pads, and the photo imageable dielectric material is semi-cured; bonding a light-emitting diode on the conductive pads, such that an orthogonal projection of the light-emitting diode on the substrate is overlapped with an orthogonal projection of the photo imageable dielectric material on the substrate; forming a black matrix to cover the conductive pads and the light-emitting diode; and forming an encapsulant to cover the black matrix and the light-emitting diode.

In some embodiments, disposing the photo imageable dielectric material further includes coating a photo imageable dielectric material layer that is uncured; and patterning the photo imageable dielectric material to form the semi-cured photo imageable dielectric material.

In some embodiments, bonding the light-emitting diode further includes curing the photo imageable dielectric material simultaneously, such that a bottom surface of the light-emitting diode facing the substrate is in contact with the photo imageable dielectric material.

In some embodiments, the manufacturing method includes coating a black matrix to cover the substrate and the light-emitting diode, such that the black matrix is in contact with a side wall of the light-emitting diode; and reducing a thickness of the black matrix, such that a top surface of the light-emitting diode facing the substrate is exposed from the black matrix.

In some embodiments, reducing the thickness of the black matrix further includes exposing a portion of the side wall of the light-emitting diode from the black matrix.

In the aforementioned embodiments, the photo imageable dielectric material can support adhesion between the light-emitting diode and the substrate by disposing the photo imageable dielectric material between the light-emitting diode and the substrate. With such design, the reliability and the flatness of the package structure can be improved. Through the manufacturing method of the present disclosure, there is no slit between the black matrix and the light-emitting diodes, and therefore the LED display can have high contrast color performance. In addition, the step of bonding the light-emitting diodes and the step of curing the photo imageable dielectric material may be performed simultaneously, and therefore there is no need for extra heating process after the step of bonding.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
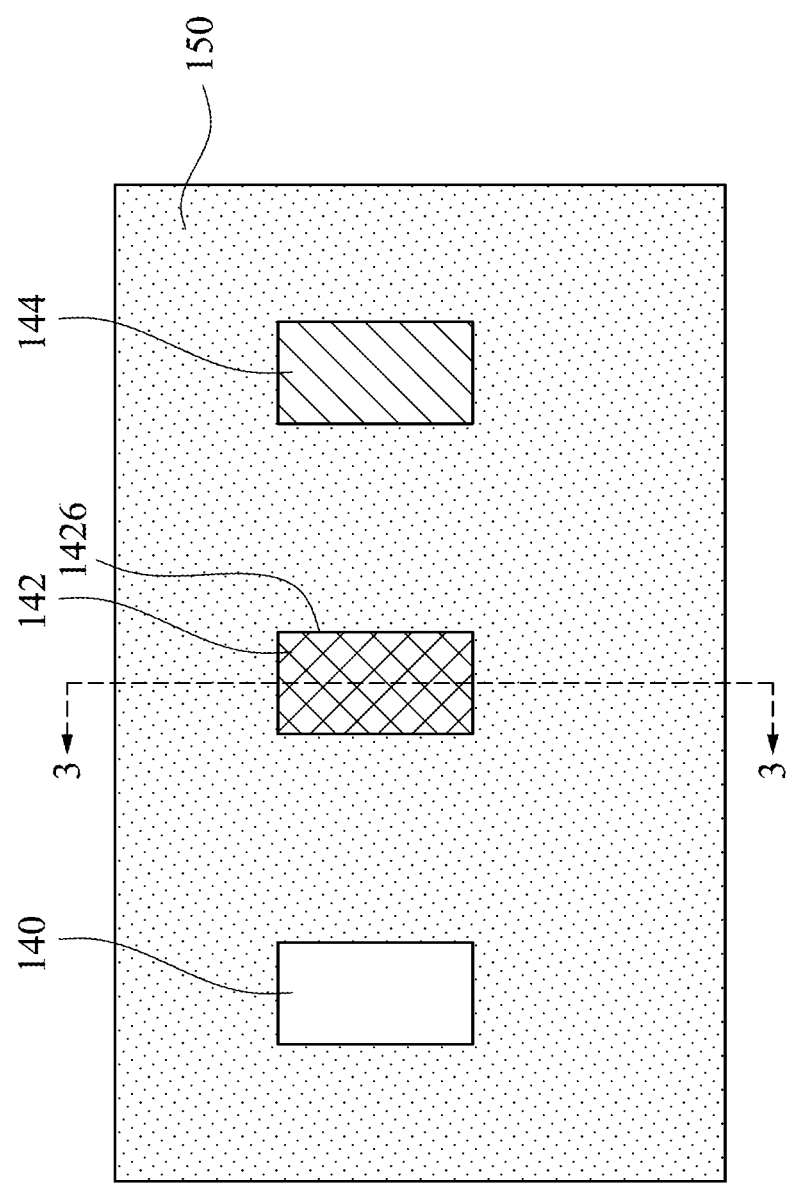
FIG. 1 is a top view of the package structure according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
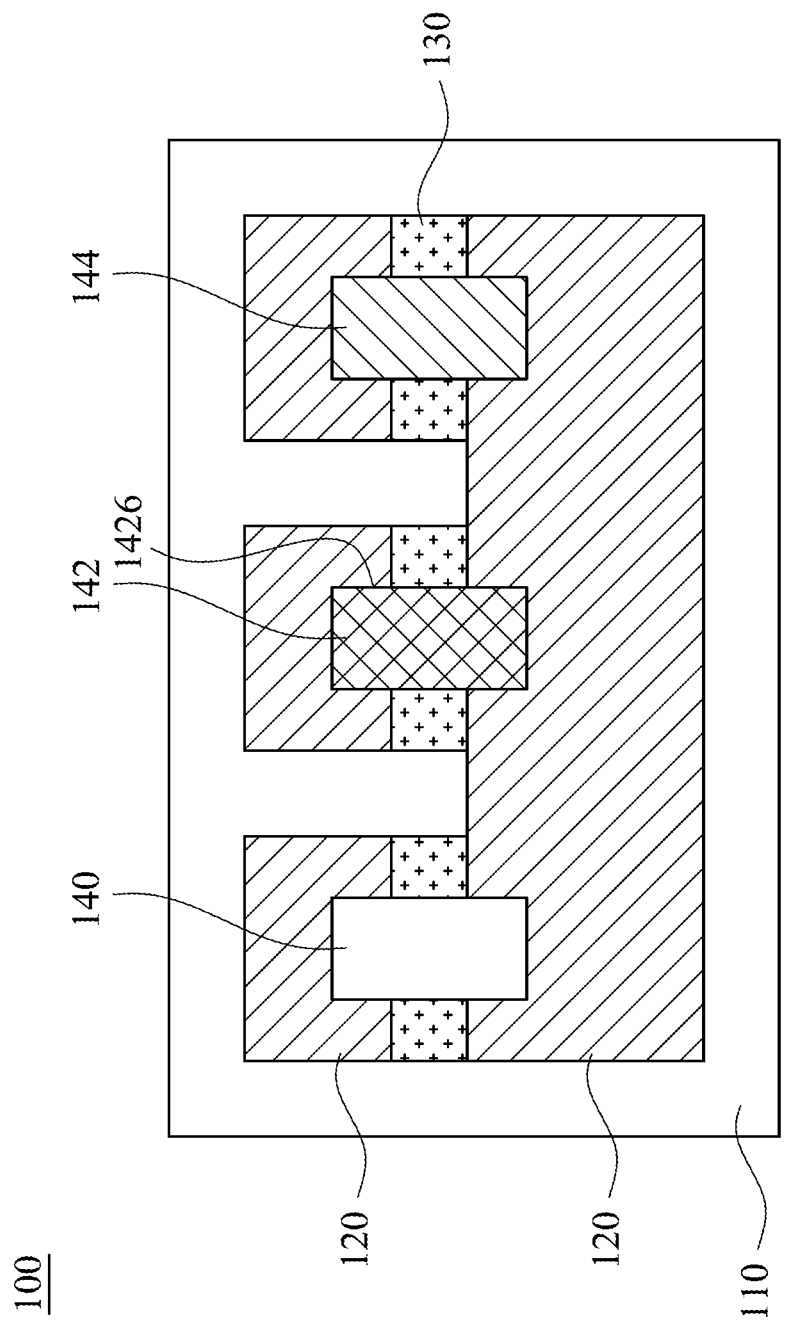
FIG. 2 is a top view of the package structure in FIG. 1, and the black matrix is omitted.
Figure 3:
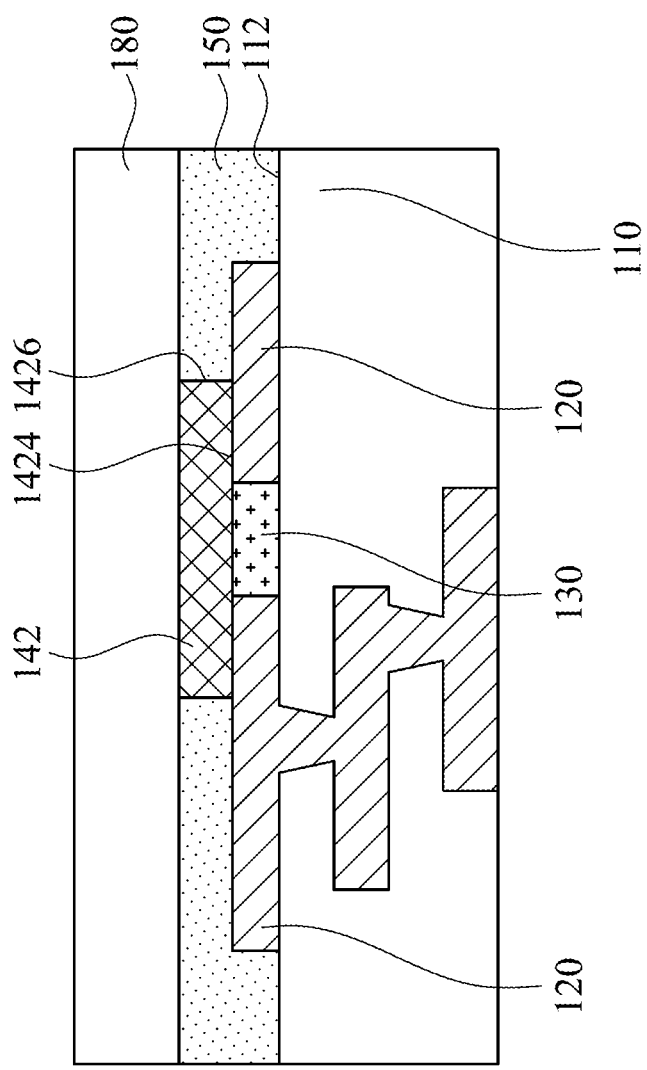
FIG. 3 is a cross-sectional view taken along line 3-3 in FIG. 1.

FIG. 1 is a top view of the package structure 100 according to one embodiment of the present disclosure. FIG. 2 is a top view of the package structure 100 in FIG. 1, and the black matrix 150 is omitted. FIG. 3 is a cross-sectional view taken along line 3-3 in FIG. 1. For convenience, the black matrix 150 is omitted in FIG. 1 and FIG. 2. Reference is made to FIGS. 1 to 3 simultaneously. The package structure 100 includes a substrate 110, multiple conductive pads 120, a photo imageable dielectric (PID) material 130, light-emitting diodes (LED) 140, 142, 144, and a black matrix 150. The light-emitting diodes 140, 142, 144 can be Micro LEDs or Mini LEDs. The light-emitting diodes 140, 142, 144 of the present embodiment respectively emit red color, green color, and blue color, but the present disclosure is not limited thereto.

As shown in FIG. 3, the substrate 110 includes a top surface 112. The conductive pads 120 are located on the top surface 112 of the substrate 110. The light-emitting diodes 140、142、144 are located on the conductive pads 120. The photo imageable dielectric material 130 is located between the light-emitting diodes 140、142、144 and the top surface 112 of the substrate 110 and between the conductive pads 120. As shown in FIG. 2, orthogonal projections of the light-emitting diodes 140、142、144 on the substrate is overlapped with an orthogonal projection of the photo imageable dielectric material 130 on the substrate 110. The light-emitting diodes 140、142、144 are electrically connected with the conductive pads 120, and the photo imageable dielectric material 130 fills the gaps between the conductive pads, the light-emitting diodes 140、142、144, and the substrate 110.

As shown in FIG. 1 and FIG. 3, the black matrix 150 is located on the top surface 112 of the substrate 110 and the conductive pads 120. The black matrix 150 surrounds the light-emitting diode 142, and the black matrix 150 is in contact with the side wall 1426 of the light-emitting diode 142. Specifically, the conductive pads 120 is completely covered by the black matrix 150. That is, only the light-emitting diodes 140、142、144 are exposed from the black matrix 150, and there is no slit between the black matrix 150 and the light-emitting diode 142. As such, contrast reduction due to the light from the light-emitting diodes 140、142、144 being reflected can be prevented. Therefore, the package structure 100 of the present disclosure can be utilized to manufacture a LED display having high contrast color performance.

In a conventional package structure, there are gaps between the light-emitting diodes and the substrate after coating the black matrix material. Although the black matrix material is filled into the gaps, there will be bubble formed during the subsequent processes with high temperature. Such problems may reduce reliability or degrade the LED mass transfer effect. As shown in FIG. 3, in the package structure 100 of the present disclosure, the gaps between the light-emitting diode 142 and the substrate 110 is filled by the photo imageable dielectric material 130. The photo imageable dielectric material 130 is in contact with the bottom surface 1424 of the light-emitting diode 142 facing the substrate 110, such that the photo imageable dielectric material 130 can support adhesion between the light-emitting diode 142 and the substrate 110. With such design, the reliability and the flatness of the package structure 100 can be improved.

Figure 4:
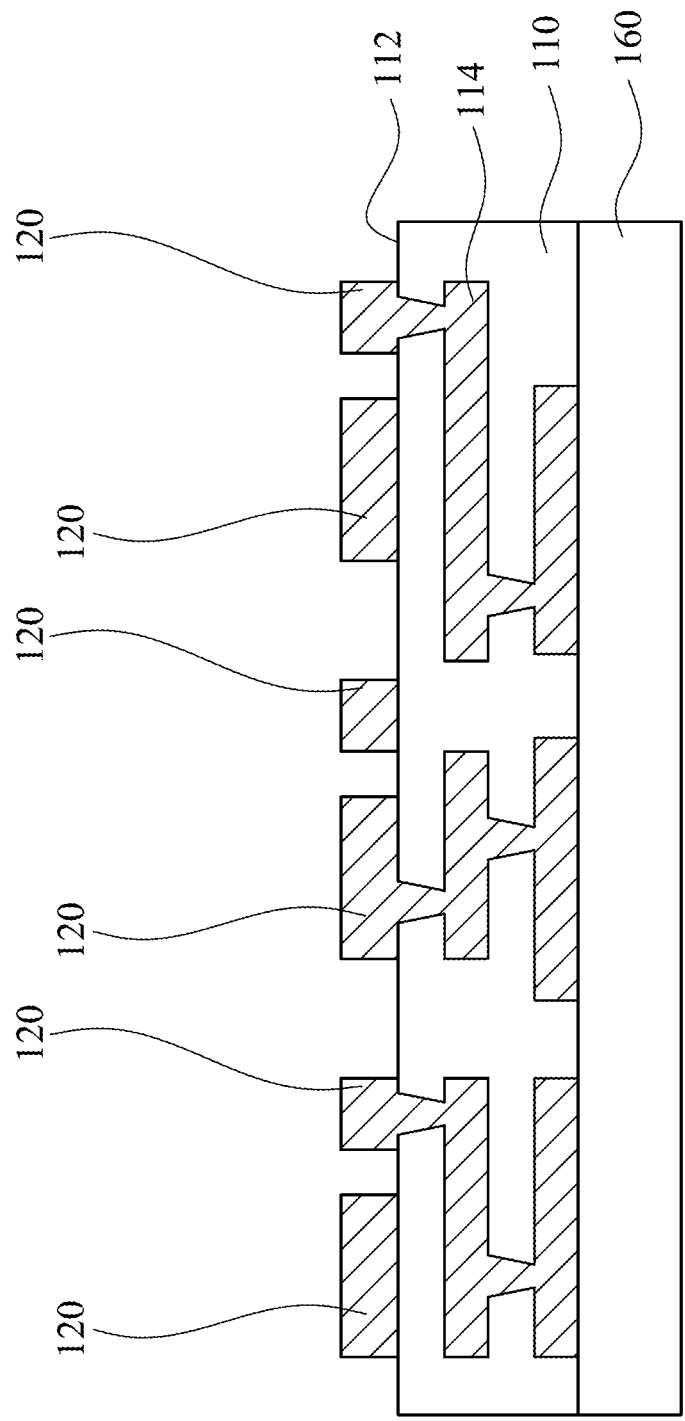
FIGS. 4 to 9 are cross-sectional views of a manufacturing method of a package structure according to one embodiment of the present disclosure.

FIGS. 4 to 9 are cross-sectional views of a manufacturing method of a package structure 100a according to one embodiment of the present disclosure. As shown in FIG. 4, the substrate 110 is provided first. The substrate 110 is disposed on a carrier 160. The conductive pads are formed on the top surface 112 of the substrate 110 facing away from the carrier 160. In the present embodiment, the substrate 110 includes redistribution layer 114. In other embodiments, the substrate 110 may be printed circuit board.

Figure 5:
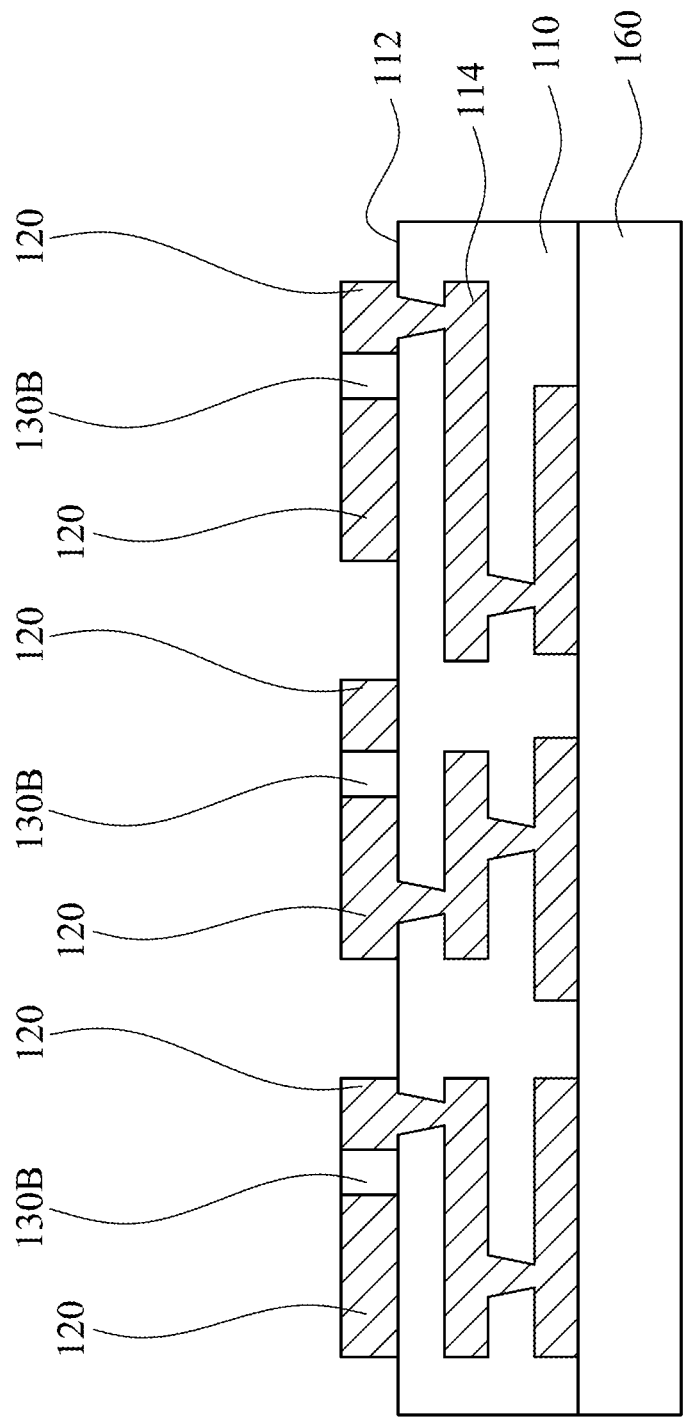

As shown in FIG. 5, the semi-cured (b-staged) photo imageable dielectric material 130b are disposed between the top surface 112 of the substrate 110 and the conductive pads 120. Specifically, in this step, the uncured photo imageable dielectric material is coated on the substrate 110 and the conductive pads 120 first. Subsequently, perform patterning step (exposure and development), and a portion of the photo imageable dielectric material located between the conductive pads 120 are remained. As described above, the semi-cured photo imageable dielectric material 130B is disposed below the light-emitting diodes 140、142、144 bonded in the subsequent steps. The regions herein represent the gaps between two conductive pads 120 used to electrical connect with the same light-emitting diode. Subsequently, the portion of the photo imageable dielectric material in the region is heated to the semi-cured state. In other words, the semi-cured photo imageable dielectric material 130B in this step is still sticky and can be deformed by pressure. The photo imageable dielectric material 130 can be categorized based on solvent, for example, the solvent with Cyclopetanone, Tetramethylammonium hydroxide (TMAOH), mixture of gamma-Butyrolactone (GBL) and Propylene glycol methyl ether acetate (PGMEA), or mixture of Sodium carbonate ($Na_2CO_3$) and Potassium carbonate ($K_2CO_3$) as base material.

Figure 6:
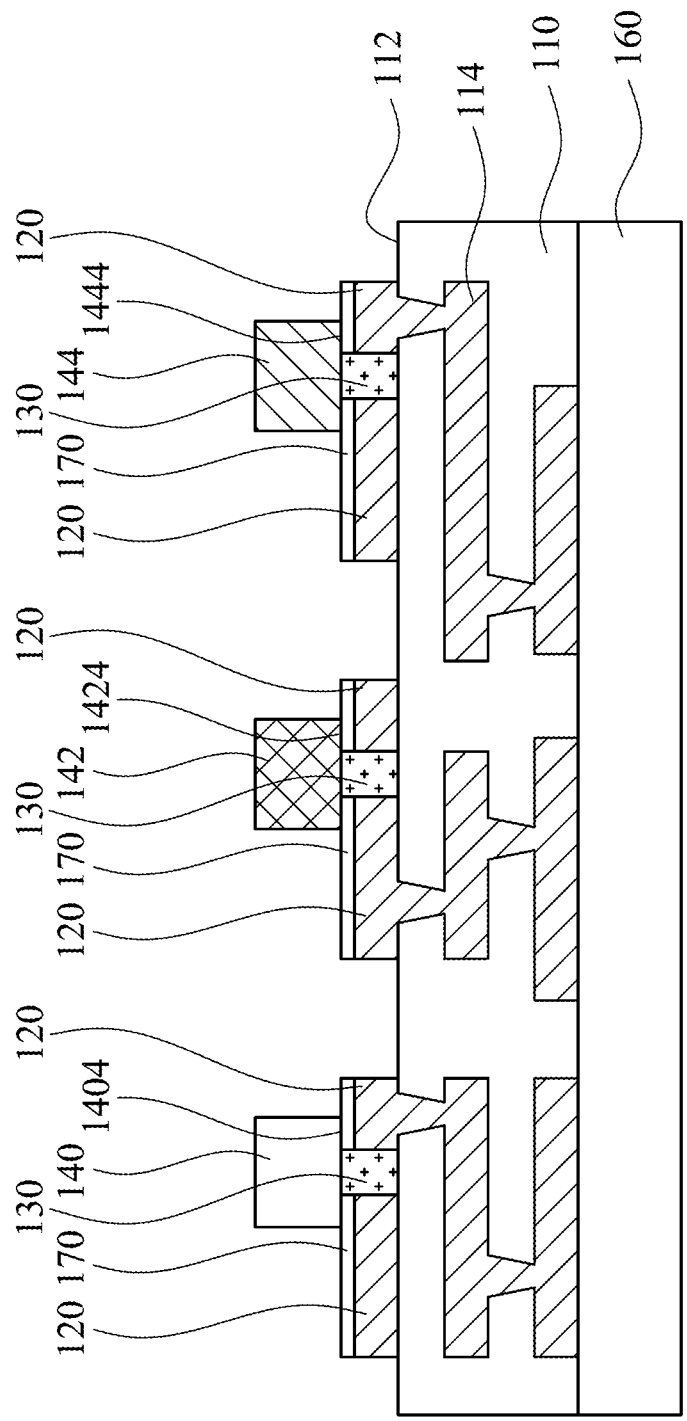

As shown in FIG. 6, the light-emitting diodes 140、142、144 are bonded on the conductive pads 120 and the photo imageable dielectric material 130. Specifically, there is surface treatment layer 170 on the conductive pad 120 configured to avoid oxidation of the conductive pads 120. The step of bonding the light-emitting diodes 140、142、144 can be performed through Mass transfer. In the step of bonding, the semi-cured photo imageable dielectric material 130B is heated to cure by heat form the transfer head, the chamber or the platform. For example, temperature of the ambient environment may be raised to about 150 degrees to 260 degrees. As such, the step of bonding and the step of curing the photo imageable dielectric material 130 may be performed simultaneously, and therefore there is no need for extra heating process after the step of bonding. In addition, the pressured used to bonding the light-emitting diodes 140、142、144 to the conductive pads 120 and the photo imageable dielectric material 130 may compress the semi-cured photo imageable dielectric material 130B such that the bottom surfaces 1404, 1424, 1444 of the light-emitting diodes 140、142、144 facing the substrate 110 are in contact with the photo imageable dielectric material 130. As such, the photo imageable dielectric material 130 can support adhesion between the light-emitting diodes 140、142、144 and the substrate 110. With such design, the reliability and the flatness of the package structure 100a can be improved.

Figure 7:
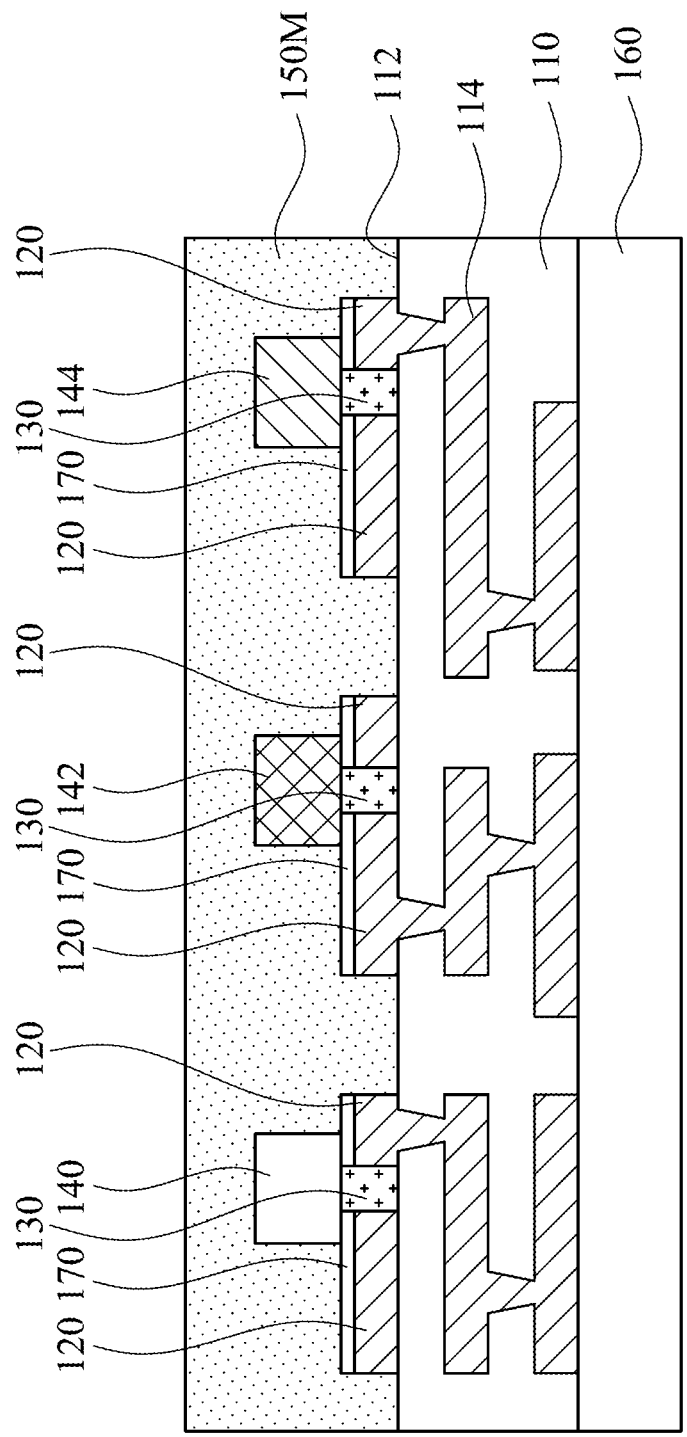

As shown in FIG. 7, coating the black matrix material 150M so as to cover the conductive pads 120 and the light-emitting diodes 140、142、144. Since the gaps between the light-emitting diodes 140、142、144 and the substrate 110 have been filled by the photo imageable dielectric material 130. As described above, such method can avoid bubble in the black matrix material 150M formed in the subsequent processes due to high temperature, and therefore it can avoid reliability reduction or LED mass transfer effect degrade.

Figure 8:
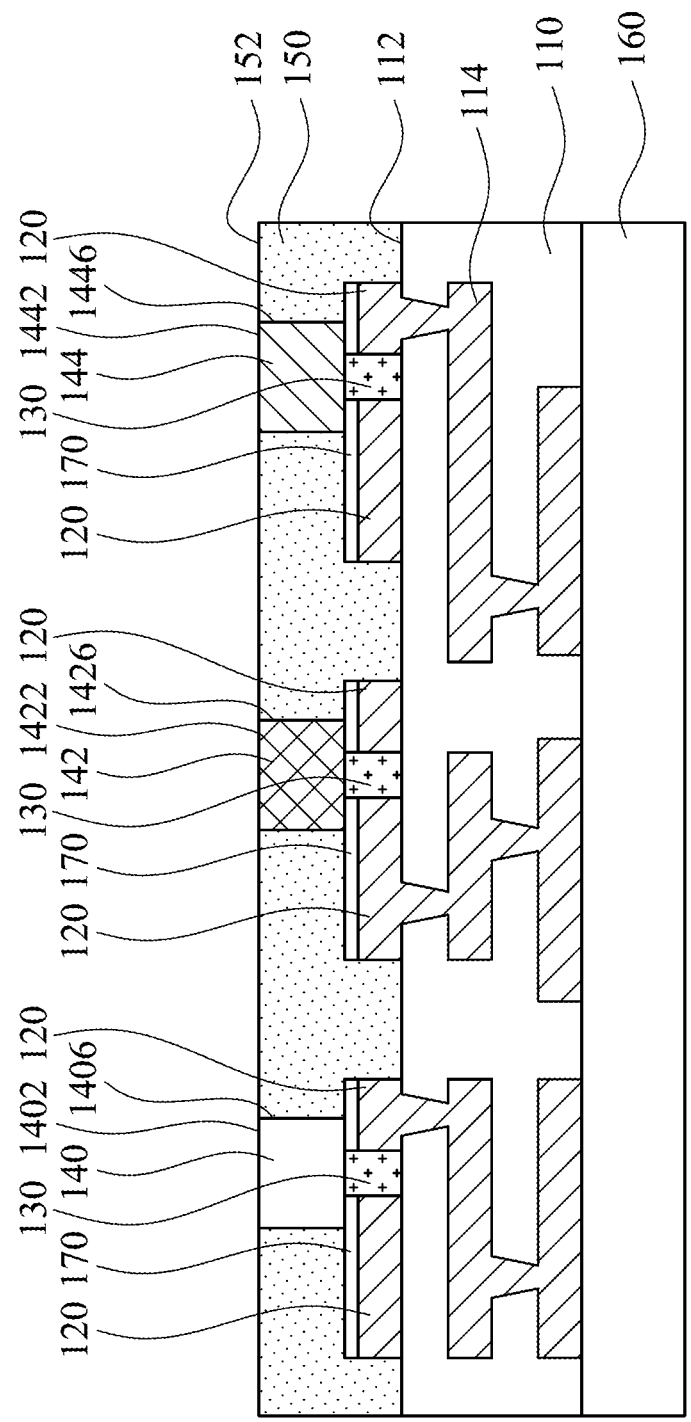

As shown in FIG. 7 and FIG. 8, thickness of the black matrix material 150M is reduced. As shown in FIG. 8, the top surfaces 1402, 1422, 1442 of the light-emitting diodes 140、142、144 facing away form the substrate 110 are exposed form the black matrix 150. In the present embodiment, thickness reduction of the black matrix material 150M can be performed through chemical mechanical planarization (CMP) or grinding. The top surface 152 of the black matrix 150 after thickness reduction are level with the top surfaces 1402, 1422, 1442 of the light-emitting diodes 140、142、144. Accordingly, there is no need for exposure and development process to exposing the top surfaces 1402, 1422, 1442 of the light-emitting diodes 140、142、144 from the black matrix 150 in the manufacturing method of the present disclosure.

In a conventional method, tolerance of the exposure and the development of the black matrix is about 100 um, and therefore the conductive pads 120 cannot be completely covered by the patterned black matrix. In other words, there is slit between the black matrix and the light-emitting diode. The conductive pads may reflect the lights from the light-emitting diodes, and therefore the contrast is reduced.

Reference made to FIG. 2 and FIG. 8, the steps of exposure and development for the black matrix material 150M are omitted in the manufacturing method of the present disclosure. Therefore, the black matrix 150 is in contact with the side walls 1406, 1426, 1446 of the light-emitting diodes 140、142、144. Through the manufacturing method of the present disclosure, the black matrix 150 surrounds the light-emitting diodes 140、142、144, and there is no slit between the black matrix 150 and the light-emitting diodes 140、142、144.

Figure 9:
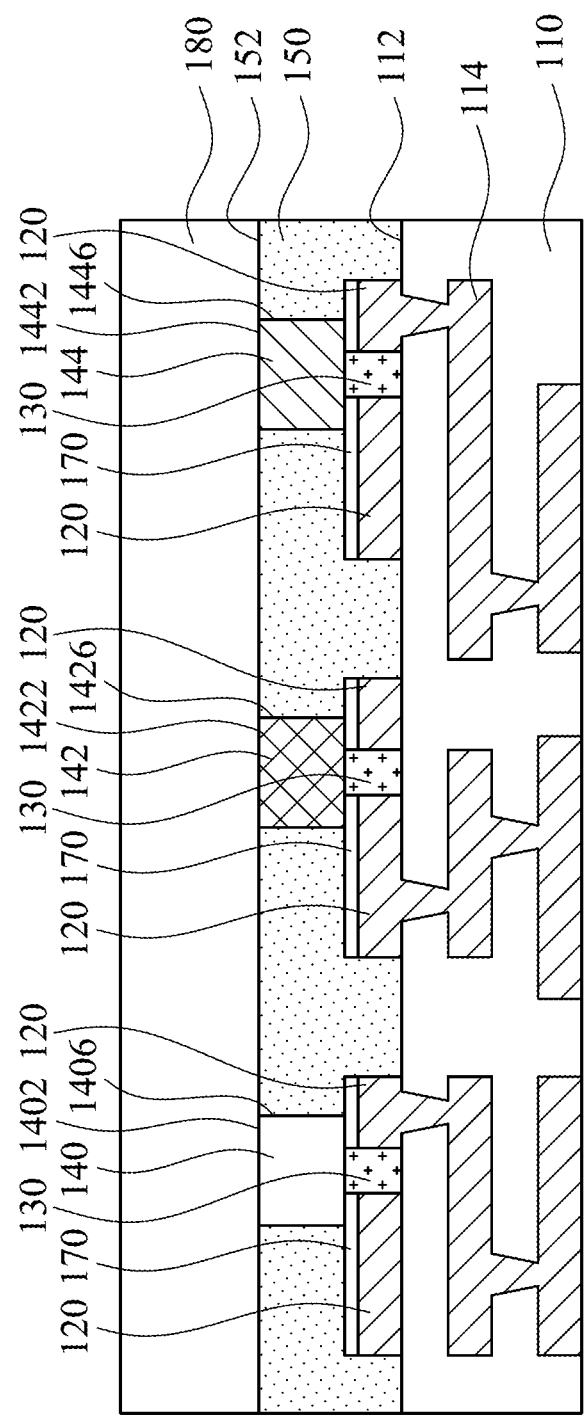

As shown in FIG. 9, the encapsulant 180 are formed to cover the black matrix 150 and the light-emitting diodes 140、142、144. Since the black matrix 150 completely covers the conductive pads 120, the encapsulant 180 and the conductive pads 120 can be separated by the black matrix 150. As described above, contrast reduction due to the light from the light-emitting diodes 140、142、144 being reflected by the conductive pads 120 can be prevented, and therefore the LED display can have high contrast color performance.

Figure 10:
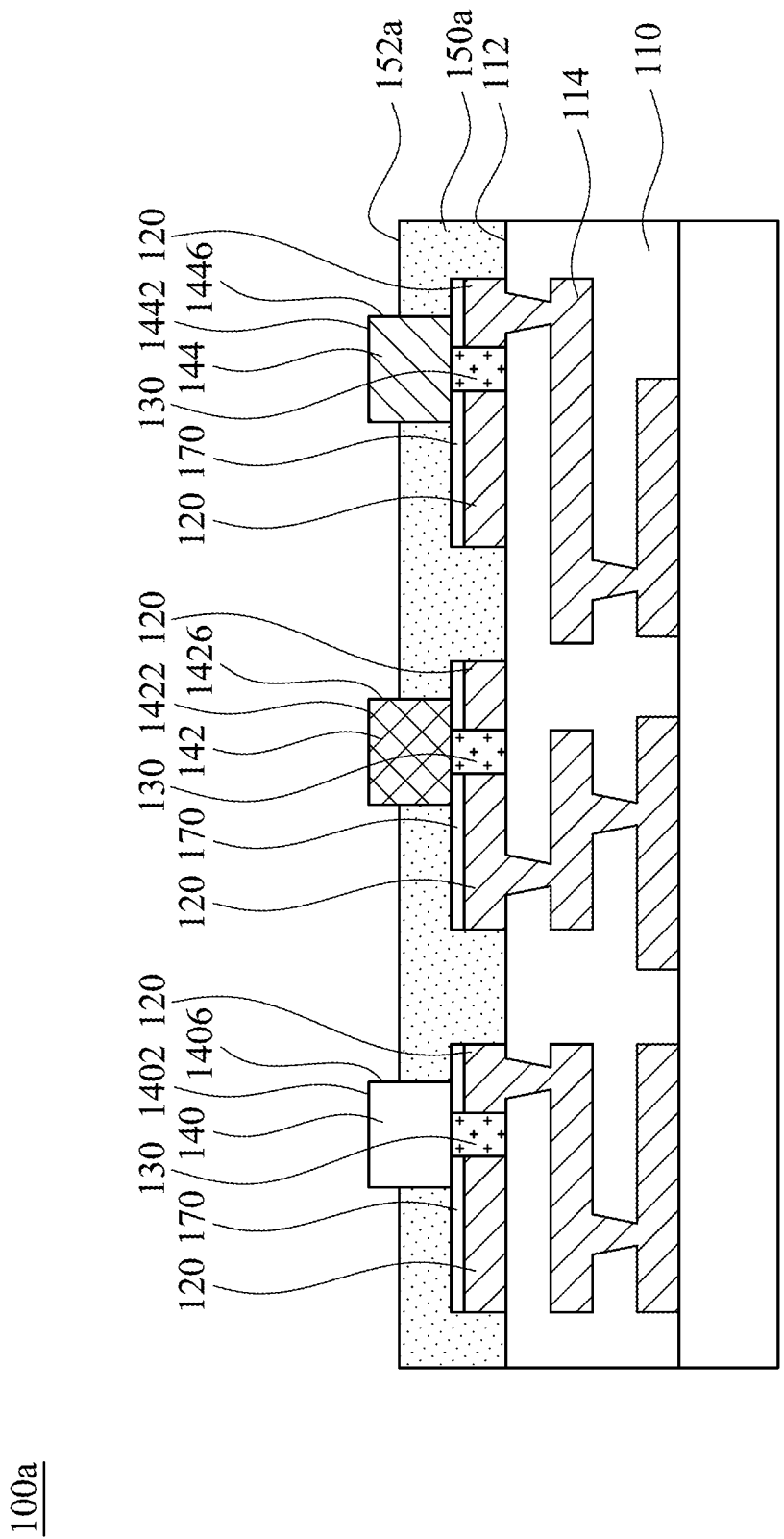
FIGS. 10 to 11 are cross-sectional views of a manufacturing method of a package structure according to another embodiment of the present disclosure.
Figure 11:
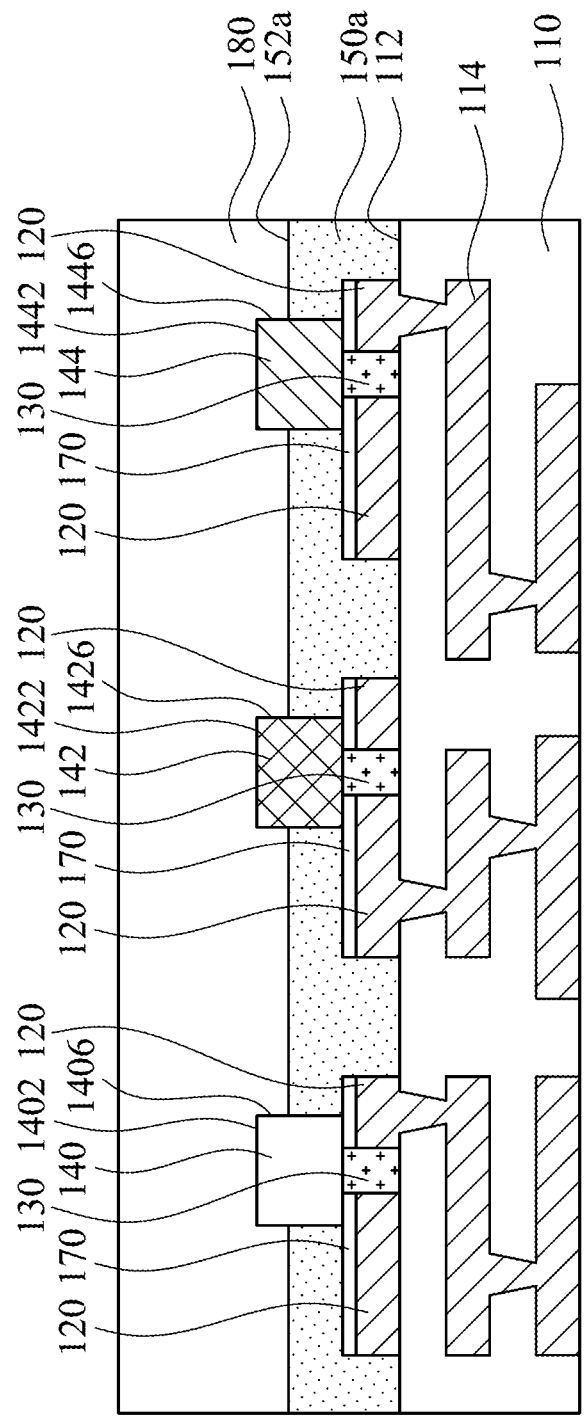

FIGS. 10 to 11 are cross-sectional views of a manufacturing method of a package structure 100b according to another embodiment of the present disclosure. The manufacturing method of the package structure 100b is the same as the steps described in the paragraphs corresponding to FIGS. 4 to 7, and the difference between the manufacturing method of the package structure 100b and the package structure 100a is the step of reducing the thickness of the black matrix material 150M.

As shown in FIG. 10, in the present embodiment, after the step of coating the black matrix material 150M (as shown in FIG. 7), reduce the thickness of the black matrix material 150M continuously. Thickness reduction of the black matrix material 150M can be performed through laser etching or plasma etching. The top surface 152a of the black matrix 150a after thickness reduction are lower than the top surfaces 1402, 1422, 1442 of the light-emitting diodes 140、142、144. A portion of each of the side walls 1406, 1426, 1446 of the light-emitting diodes 140、142、144 is exposed from the black matrix 150a. For example, thickness of the portions of the light-emitting diodes 140、142、144 protrudes from the black matrix 150a is about 1 um to 2 um. Accordingly, there is no need for exposure and development process to exposing the top surfaces 1402, 1422, 1442 of the light-emitting diodes 140、142、144 from the black matrix 150a in the manufacturing method of the present disclosure.

As shown in FIG. 11, the encapsulant 180 are formed to cover the black matrix 150a and the light-emitting diodes 140、142、144. In the present embodiment, the encapsulant 180 is in contact with the side walls 1406、1426、1446 of the light-emitting diodes 140、142、144. Since the black matrix 150a completely covers the conductive pads 120, the encapsulant 180 and the conductive pads 120 can be separated by the black matrix 150a. The package structure 100b and the package structure 100a have the same advantages, and therefore the description is not repeated hereinafter.

In summary, the photo imageable dielectric material can support adhesion between the light-emitting diode and the substrate by disposing the photo imageable dielectric material between the light-emitting diode and the substrate. With such design, the reliability and the flatness of the package structure can be improved. Through the manufacturing method of the present disclosure, there is no slit between the black matrix and the light-emitting diodes, and therefore the LED display can have high contrast color performance. In addition, the step of bonding the light-emitting diodes and the step of curing the photo imageable dielectric material may be performed simultaneously, and therefore there is no need for extra heating process after the step of bonding.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A package structure, comprising:
a substrate comprising a top surface;
a plurality of conductive pads located on the top surface of the substrate;
a light-emitting diode located on the conductive pads;
a photo imageable dielectric material located between the light-emitting diode and the top surface of the substrate and between the conductive pads, wherein an orthogonal projection of the light-emitting diode on the substrate is overlapped with an orthogonal projection of the photo imageable dielectric material on the substrate; and
a black matrix located on the top surface of the substrate and the conductive pads.

2. The package structure of claim 1, wherein the photo imageable dielectric material is in contact with a bottom surface of the light-emitting diode facing the substrate.

3. The package structure of claim 1, wherein the black matrix is in contact with a side wall of the light-emitting diode.

4. The package structure of claim 1, further comprising:
a encapsulant located above the black matrix and the light-emitting diode.

5. The package structure of claim 4, wherein the encapsulant and the conductive pads are separated by the black matrix.

6. A manufacturing method of a package structure, comprising:
forming a plurality of conductive pads on a top surface of a substrate;
disposing a photo imageable dielectric material between the top surface of the substrate and the conductive pads, wherein the photo imageable dielectric material is semi-cured;
bonding a light-emitting diode on the conductive pads, such that an orthogonal projection of the light-emitting diode on the substrate is overlapped with an orthogonal projection of the photo imageable dielectric material on the substrate;
forming a black matrix to cover the conductive pads and the light-emitting diode; and
forming an encapsulant to cover the black matrix and the light-emitting diode.

7. The manufacturing method of claim 6, wherein disposing the photo imageable dielectric material further comprises:
coating an photo imageable dielectric material layer, wherein the photo imageable dielectric material layer is uncured; and
patterning the photo imageable dielectric material layer to form the photo imageable dielectric material.

8. The manufacturing method of claim 6, wherein bonding the light-emitting diode further comprises:
curing the photo imageable dielectric material simultaneously, such that a bottom surface of the light-emitting diode facing the substrate is in contact with the photo imageable dielectric material.

9. The manufacturing method of claim 6, further comprising:
coating a black matrix to cover the substrate and the light-emitting diode, such that the black matrix is in contact with a side wall of the light-emitting diode; and
reducing a thickness of the black matrix, such that a top surface of the light-emitting diode facing the substrate is exposed from the black matrix.

10. The manufacturing method of claim 9, wherein reducing the thickness of the black matrix further comprises:
exposing a portion of the side wall of the light-emitting diode from the black matrix.

* * * * *